US011417270B2

(12) United States Patent
Bian

(10) Patent No.: US 11,417,270 B2
(45) Date of Patent: Aug. 16, 2022

(54) ORGANIC LIGHT-EMITTING DIODE DISPLAY, DISPLAY CONTROL METHOD AND ELECTRONIC DEVICE

(71) Applicant: Beijing Xiaomi Mobile Software Co., Ltd., Beijing (CN)

(72) Inventor: Qingfang Bian, Beijing (CN)

(73) Assignee: Beijing Xiaomi Mobile Software Co., Ltd., Beijing (CN)

( * ) Notice: Subject to any disclaimer, the term of this patent is extended or adjusted under 35 U.S.C. 154(b) by 0 days.

(21) Appl. No.: 16/577,803

(22) Filed: Sep. 20, 2019

(65) Prior Publication Data

US 2020/0098313 A1 Mar. 26, 2020

(30) Foreign Application Priority Data

Sep. 21, 2018 (CN) .......................... 201811110312.2

(51) Int. Cl.
*G06F 3/00* (2006.01)
*G09G 3/3225* (2016.01)
*H01L 27/32* (2006.01)

(52) U.S. Cl.
CPC ....... *G09G 3/3225* (2013.01); *H01L 27/3241* (2013.01)

(58) Field of Classification Search
None
See application file for complete search history.

(56) References Cited

U.S. PATENT DOCUMENTS

2009/0046085 A1 2/2009 Ino et al.
2009/0121973 A1 5/2009 Kim et al.
2009/0146927 A1 6/2009 Wan et al.
2013/0083008 A1 4/2013 Geisner et al.
2013/0083080 A1* 4/2013 Rappoport ........... G09G 3/3225 345/690
2016/0253941 A1* 9/2016 Wu ...................... G09G 3/2003 345/690
2017/0154943 A1* 6/2017 Yang .................. H01L 27/3276
(Continued)

FOREIGN PATENT DOCUMENTS

CN 101430861 B 3/2011
CN 103827887 A 5/2014
(Continued)

OTHER PUBLICATIONS

Extended Search Report for European Application No. 19198701.5 from the European Patent Office, dated Jan. 21, 2020.
(Continued)

*Primary Examiner* — Michael A Faragalla
(74) *Attorney, Agent, or Firm* — Finnegan, Henderson, Farabow, Garrett & Dunner, L.L.P.

(57) ABSTRACT

An organic light-emitting diode (OLED) display screen includes: a first area provided with a plurality of first light-emitting components; a second area provided with a plurality of second light-emitting components; and a driving element group electrically connected to the first light-emitting components and the second light-emitting components to drive the first light-emitting components and the second light-emitting components to emit light; wherein the driving element group is disposed on an area other than the second area on the display screen and disposed at least in the first area.

16 Claims, 8 Drawing Sheets

(56) References Cited

U.S. PATENT DOCUMENTS

| | | | | |
|---|---|---|---|---|
| 2017/0294155 | A1* | 10/2017 | Kim | G09G 3/2074 |
| 2018/0130421 | A1 | 5/2018 | Zhou et al. | |

FOREIGN PATENT DOCUMENTS

| | | | |
|---|---|---|---|
| CN | 107340661 | A | 11/2017 |
| CN | 107610635 | A | 1/2018 |
| CN | 107644895 | A | 1/2018 |
| CN | 108336117 | A | 7/2018 |
| CN | 108364957 | A | 8/2018 |
| CN | 108963370 | A | 12/2018 |
| EP | 2 950 299 | A1 | 12/2015 |
| EP | 3 057 085 | A1 | 8/2016 |
| JP | 2009-116293 | A | 5/2009 |
| JP | 2015-501004 | A | 1/2015 |
| KR | 20110123124 | A | 11/2011 |
| KR | 101275810 | B1 | 6/2013 |
| KR | 20140086990 | A | 7/2014 |
| KR | 20170024182 | A | 3/2017 |

OTHER PUBLICATIONS

Office Action for Russian Application No. 2019130433/20, dated Feb. 20, 2020.

International Search Report of counterpart PCT Application No. PCT/CN2018/114193, dated Jun. 20, 2019.

* cited by examiner

ORGANIC LIGHT-EMITTING DIODE DISPLAY, DISPLAY CONTROL METHOD AND ELECTRONIC DEVICE

CROSS-REFERENCE TO RELATED APPLICATIONS

This application is based upon and claims priority to Chinese Patent Application No. 201811110312.2, filed Sep. 21, 2018, the entire contents of which are incorporated herein by reference.

TECHNICAL FIELD

The present disclosure relates to the field of display devices, and in particular, to an organic light-emitting diode display screen, a display control method, and an electronic device.

BACKGROUND

In order to improve user experience, technicians are increasingly keen to design the display of an electronic device into a full screen. However, since functional components such as a camera usually need to be disposed on the electronic device and disposed on the same side as the display screen, at least one area needs to be left for installing such functional components. At this time, it is usually necessary to open slots at corresponding positions in the display for these functional components to install the corresponding functional components, which makes it difficult to display the full screen, and at the same time, the display screen needs to be opened with slots, and thus the preparation process is complicated.

SUMMARY

In order to overcome the problems in the related art, the present disclosure provides an organic light-emitting diode display, a display control method, and an electronic device that can conveniently implement a full screen.

According to a first aspect of the embodiments of the present disclosure, there is provided an organic light-emitting diode (OLED) display screen, including: a first area provided with a plurality of first light-emitting components; a second area provided with a plurality of second light-emitting components; and a driving element group electrically connected to the first light-emitting components and the second light-emitting components to drive the first light-emitting components and the second light-emitting components to emit light; wherein the driving element group is disposed in an area other than the second area on the display screen and disposed at least in the first area.

According to a second aspect of the embodiments of the present disclosure, there is provided a display control method applied in an organic light-emitting diode (OLED) display screen, wherein the display screen includes a first area provided with a plurality of first light-emitting components, a second area provided with a plurality of second light-emitting components, and a driving element group disposed in an area other than the second area on the display screen and disposed at least in the first area. The method includes: receiving a display control signal; and driving the first light-emitting components and the second light-emitting components to emit light by using the driving element group according to the display control signal.

According to a third aspect of the embodiments of the present disclosure, there is provided an electronic device, including the organic light-emitting diode display screen according to the first aspect.

The technical solutions provided by the embodiments of the present disclosure may include the following beneficial effects.

In the embodiments of the present disclosure, the driving element may not be provided in a part of the display area of the display screen, and the driving element disposed in another area is used for driving the light-emitting by electrical connection, so that the part of the area may be in a transparent state. In addition, when disposing a functional component such as a camera or the like, the functional component can be directly placed in the area with the transparent state, without having to open a slot for the functional component or leave a position on a display screen, which is convenient for the full screen design of the display screen.

It is to be understood that both the foregoing general description and the following detailed description are exemplary and explanatory only and are not restrictive of the disclosure, as claimed.

BRIEF DESCRIPTION OF THE DRAWINGS

The accompanying drawings, which are incorporated in the specification and constitute part of the present specification, illustrate the embodiments in accordance with the present disclosure and explain the principle of the present disclosure together with the specification.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the disclosure. Instead, they are merely examples of apparatuses and methods consistent with aspects related to the disclosure as recited in the appended claims.

Figure 1:
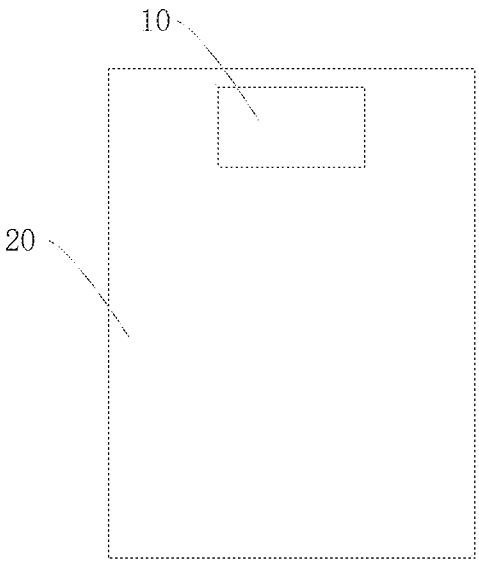
FIG. 1 illustrates a schematic diagram of an OLED display screen according to an embodiment of the present disclosure.

FIG. 1 illustrates a schematic diagram of an organic light-emitting diode (OLED) display screen according to an embodiment of the present disclosure. The OLED display screen in the embodiments of the present disclosure may be applied to any electronic device having a display function, such as a mobile phone, a computer, a video player, a television, a smart bracelet, a smart watch, etc., and all the electronic devices having the display function may apply the OLED display screen provided by the embodiments of the present disclosure, which is not specifically limited by the present disclosure. In the OLED display screen of the embodiments of the present disclosure, the driving element is not provided in a part of the display area of the display screen, and the driving element disposed in other area is used for driving the light-emitting by electrical connection, so that the part of the area may be in a transparent state; and when disposing functional components such as a camera or the like, the functional components can be directly placed in the area with the transparent state, without having to slot for the functional components or leave other position, which is convenient for the full screen design of the display.

As shown in FIG. 1, the OLED display screen of an embodiment of the present disclosure may include a first area 10 and a second area 20. The first area 10 and the second area 20 may each be provided with a plurality of light-emitting components. The light-emitting components may form respective pixels of the OLED display screen, and the plurality of light-emitting components may be arranged in a plurality of rows and columns, then different colors and images may be displayed on the display screen by performing display driving control on each pixel. The arrangement manner of individual light-emitting components is not limited by the embodiment of the present disclosure, and may be implemented by means in the related art. In order to facilitate the description of the embodiments of the present disclosure, a light-emitting component disposed in the first area 10 is referred to as a first light-emitting component 11, and a light-emitting component disposed in the second area 20 is referred to as a second light-emitting component 21. Also, the first area 10 includes at least one first light-emitting component 11 and the second area includes at least one second light-emitting component 21 (as shown in FIG. 2).

Each of the light-emitting components of the embodiments of the present disclosure may include at least one light-emitting unit, and the light-emitting unit(s) in each of the light-emitting components may have the same light-emitting color, or may have different light-emitting colors, or a part of the light-emitting units may have the same light-emitting color. Each of the light-emitting units may include at least one light-emitting diode, and based on the material of the light-emitting diode, the light-emitting color of the corresponding light-emitting unit may be determined, thereby driving control of each of the light-emitting units is implemented, that is, the light-emitting control of the entire light-emitting components may be realized.

Figure 2:
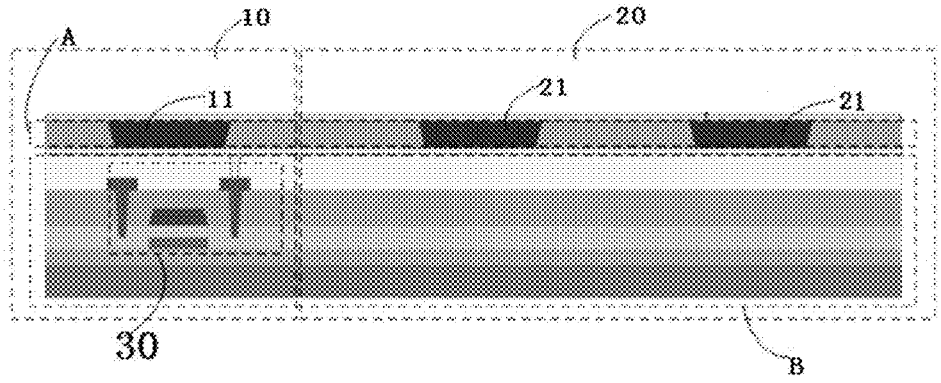
FIG. 2 illustrates a schematic diagram of a driving cross-sectional structure of an OLED display screen according to an embodiment of the present disclosure.

FIG. 2 illustrates a schematic diagram of a driving cross-sectional structure of an OLED display screen according to an embodiment of the present disclosure. The light-emitting components in the first area 10 and the second area 20 may be driven and emit light according to a received electrical signal, for example, when the received voltage is greater than a voltage threshold, or the received current is greater than a current threshold, the light-emitting component may be driven and emit light. In the embodiment of the present disclosure, a driving element group 30 may be disposed on an area other than the second area 20, for example, the driving element group 30 may be disposed in the first area 10, or may be disposed in the first area 10 and a spacing area between the first area 10 and the second area 20. Also, the driving element group 30 may be used to drive the first light-emitting component 11 and the second light-emitting component 21 to emit light.

In addition, the driving element group of the embodiment of the present disclosure may be located in a TFT (Thin Film Transistor) substrate of the display screen, constitute a display driving circuit of the OLED display screen, and is configured to perform the driving control of the first light-emitting component 11 in the first area 10 and the second light-emitting component 21 in the second area 20 according to the received display control signal. For the circuit structure of the driving element group 30, a person skilled in the art can select an appropriate circuit structure to perform the above-described driving control according to requirements, which is not limited by the embodiment of the present disclosure.

In addition, in order to ensure the flatness of the display screen and the transparent state of the second area, the light-emitting components in the first area 10 and the second area 20 may be located in a light-emitting layer A, and a driving layer B may be disposed under the light-emitting layer A. The driving element group 30 is disposed in the driving layer B, the driving layer B corresponding to the second area 20 may not be provided with the driving element group, but the driving layer B of the second area 20 may be formed of the transparent material substrate, and is flush with the driving layer of the first area, so as to ensure the flatness of the first area and the second area. In addition, an insulating layer, a buffer layer, or the like may be disposed between the driving layer and the light-emitting layer to avoid the influence on the light-emitting layer. The insulating layer may include any insulating material, and the embodiment of the present disclosure is not limited thereto.

In addition, in the embodiment of the present disclosure, the driving element group may be electrically connected to the second light-emitting component through a conductive medium (not shown), and the conductive medium may include a metal wire or a conductive adhesive layer. In other embodiments of the present disclosure, the conductive medium may also be any electrical conductor. As long as the electrical conductor can transmit the driving signal of the driving element group 30 to the second light-emitting component 21, such electrical conductor may function as the conductive medium of the embodiment of the present disclosure. Based on this, since the second area 20 may not be provided with any driving element group in the embodiment of the present disclosure, the second area 20 in the display screen may present a transparent state.

In order to increase the transparency of the second area 20, the conductive medium in the embodiments of the present disclosure may be composed of a transparent conductive material, thereby reducing the influence of the conductive medium on transparency. For example, the transparent conductive material may be a transparent conductive adhesive layer, or a transparent electrode or the like, which is not limited in the embodiment of the present disclosure.

Based on the above configuration, since the driving element group 30 is not disposed in the second area 20 in the embodiment of the present disclosure, the second area 20 may have transparency and may exhibit a transparent state. Functional components such as a camera may be disposed under the light-emitting component of the second area 20, without having to open empty slots for these functional components, so that a full screen design can be conveniently realized, and a complicated process due to opening a slot or the like can be reduced.

Figure 3:
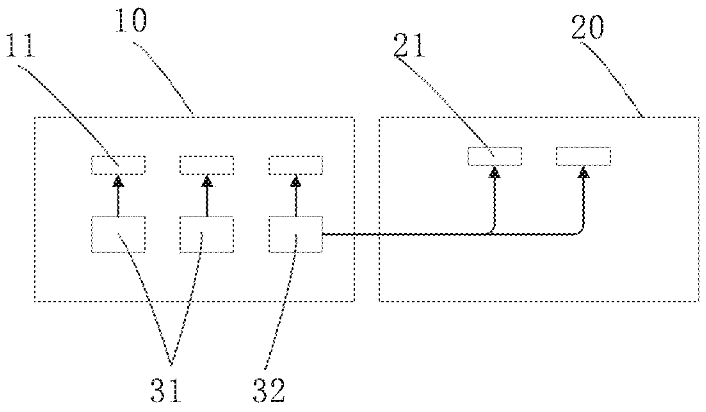
FIG. 3 illustrates a schematic diagram of a driving element group of an OLED display screen according to an embodiment of the present disclosure.

The driving element group in the embodiment of the present disclosure will be described in detail below. FIG. 3 illustrates a schematic diagram of a driving element group, such as the driving element group 30, of an OLED display screen according to an embodiment of the present disclosure. In some embodiments of the present disclosure, the driving element group 30 may include: a plurality of first driving elements 31 and at least one second driving element 32, and the first driving elements 31 and the second driving element(s) 32 are both disposed in the first area 10. The first driving element 31 is electrically connected only to the corresponding first light-emitting component 11 to drive the connected first light-emitting component 11 to emit light; and the second driving element is electrically connected to the corresponding first light-emitting component 11 and the second light-emitting component 21 to drive the connected first light-emitting component 11 and second light-emitting component 21 to emit light. That is, each of the first driving elements 31 may be electrically connected only to the first light-emitting component 11, and each of the second driving elements 32 may be electrically connected to the first light-emitting component 11 and the second light-emitting component 21. Moreover, in some embodiments, each of the first driving elements 31 may be used only for driving one first light-emitting component 11, and the second driving element 32 may also be used only for driving one first light-emitting component 11 and simultaneously driving at least one second light-emitting component 21. There may be multiple second driving elements 32, which is not limited by the embodiment of the present disclosure.

With the above configuration, it is possible to simultaneously drive the second light-emitting component by a part of the driving elements for driving the first light-emitting component, and it is convenient to increase the light transmittance of the second area without additionally providing the driving element.

Figure 4:
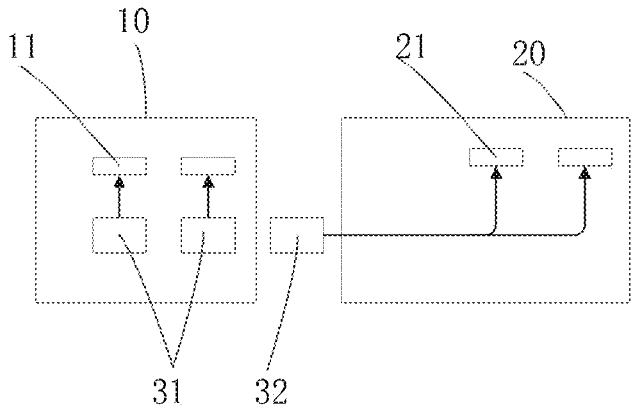
FIG. 4 illustrates a schematic diagram of a driving element group of an OLED display screen according to an embodiment of the present disclosure.
Figure 5:
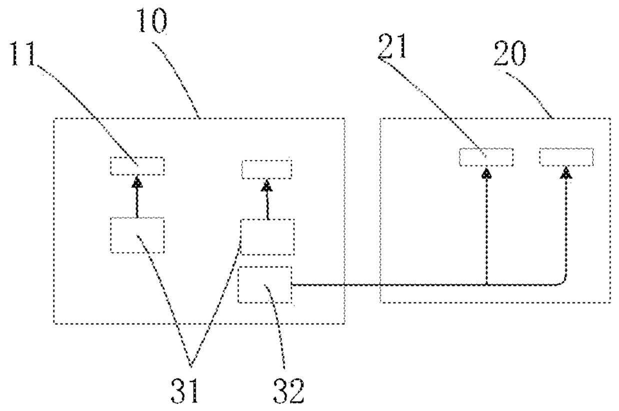
FIG. 5 illustrates a schematic diagram of a driving element group of an OLED display screen according to an embodiment of the present disclosure.

FIGS. 4 and 5 illustrate schematic diagrams of a driving element group of an OLED display screen according to an embodiment of the present disclosure. The driving element for driving the second light-emitting component may be separately disposed in an area other than the second area 20. As shown in FIG. 4, in some embodiments of the present disclosure, the driving element group 30 may include: a plurality of first driving elements 31 and at least one second driving element 32, wherein the first driving elements 31 are disposed in the first area 10, the at least one second driving element 32 is disposed in a spacing area between the first area 10 and the second area 20, the first driving elements 31 are electrically connected in one-to-one correspondence with the first light-emitting components 11 to drive the connected first light-emitting component 11 to emit light, and the second driving element 32 is only electrically connected to the second light-emitting component 21 to drive the connected second light-emitting component 21 to emit light. There may be multiple second driving elements 32, which is not limited by the embodiment of the present disclosure. The electrical connection between the second light-emitting components and the at least one second driving element 32 may be implemented by a conductive medium, respectively.

As shown in FIG. 5, in some embodiments of the present disclosure, the driving element group 30 may include: a plurality of first driving elements 31 and at least one second driving element 32, wherein the first driving elements 31 and the at least one second driving element 32 are both disposed in the first area 10, and the first driving elements 31 are electrically connected in one-to-one correspondence with the first light-emitting components 11 to drive the connected first light-emitting component 11 to emit light; and the second driving element 32 is only electrically connected to the second light-emitting component 21 to drive the connected second light-emitting component 21 to emit light. There may be multiple second driving elements 32, which is not limited in the embodiment of the present disclosure. The electrical connection of the second light-emitting components and the second driving elements 32 may be implemented by a conductive medium, respectively.

With the above configuration, for each of the first light-emitting components, a corresponding first driving element may be separately disposed in the first area, and the second driving element for driving the second light-emitting component may also be disposed in a spacing area between the first area and the second area, so that the second light-emitting component in the second area can be individually controlled without being limited by the light-emitting form of the first light-emitting components in the first area.

In other embodiments of the present disclosure, the driving element group 30 may include a plurality of first driving elements 31 and at least one second driving element 32. The first driving elements 31 may be disposed in the first area, and each of the first driving elements may be electrically connected to the corresponding first light-emitting component 11 while the at least one second driving elements 32 may be simultaneously disposed in the first area and the spacing area, and the at least one second driving element 32 may be connected only to the second light-emitting component, or the at least one second driving element 32 may also be connected to the first light-emitting component and the second light-emitting component respectively, which is not limited by the embodiment of the present disclosure. The arrangement of the second driving element(s) in the embodiments of the present disclosure may be any combination of the above embodiments.

Based on the arrangement of the driving element group 30 in the above embodiment, the driving of the second light-emitting component and the transparent display of the second area can be achieved. The manner of connecting the second driving elements 32 and the second light-emitting components 21 in the second area 20 in the embodiments of the present disclosure will be described in detail below. In the embodiment of the present disclosure, the second light-emitting components 21 in the second area 20 may be driven by one driving element 32, that is, each of the second light-emitting components 21 in the second area 20 may be connected to the same second driving element 32. And the second driving element 32 may be disposed in the first area or the spacing area.

The following is a detailed description of the structure of individual driving elements in the driving element group of the embodiment of the present disclosure. The driving elements (the first driving element and the second driving element) in the embodiment of the present disclosure may include a plurality of driving units, the number of the driving units may correspond to the number of the light-emitting units in the light-emitting component, that is, each of the drive units may correspond to one light-emitting unit, thereby implementing driving control of the light-emitting unit by the corresponding driving unit. As described above, the light-emitting component may have the light-emitting units of different light-emitting colors. Therefore, each of the driving units may correspond to the light-emitting units of different light-emitting colors, so that the driving units are connected in one-to-one correspondence with the light-emitting units of the respective light-emitting colors. For example, the driving units in the first driving element in the embodiment of the present disclosure are respectively connected to the light-emitting units in the first light-emitting component to which the first driving element is connected, and the driving units in the second driving element are respectively connected in one-to-one correspondence with the light-emitting units in the second light-emitting components, and when the second driving element is further connected to the first light-emitting component, the driving units in the second driving element are respectively connected in one-to-one correspondence with the light-emitting units in the first light-emitting component, and the light-emitting units connected to the same driving unit have the same light-emitting color.

Figure 6:
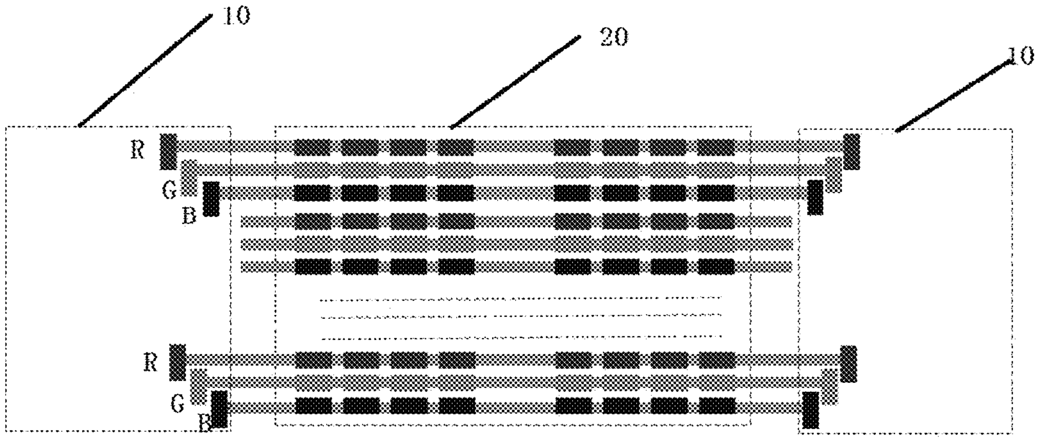
FIG. 6 is a schematic diagram showing a connection relationship between a light-emitting unit and a driving unit in an OLED display screen according to an embodiment of the present disclosure.

FIG. 6 is a schematic diagram showing a connection relationship between a light-emitting unit and a driving unit in an OLED display screen according to an embodiment of the present disclosure. The first light-emitting component and the second light-emitting component may respectively include three light-emitting units, and the three light-emitting units may be an R light-emitting unit, a G light-emitting unit and a B light-emitting unit, respectively, and the first driving element may include three driving units, the three driving units are respectively connected to the three light-emitting units in one-to-one correspondence, and the second driving unit may also include three driving units, and the three driving units may also be connected to the three light-emitting units respectively, such that the light-emitting state or the light-emitting intensity of the light-emitting units can be individually controlled. Meanwhile, if the second driving element is further connected to the first light-emitting component, the three driving units may also be respectively connected to the three light-emitting units of the first light-emitting component in one-to-one correspondence, and the light-emitting units of the same color are connected to the same driving unit. That is, if one driving unit is connected to the R light-emitting unit in the first light-emitting component, this driving unit is also electrically connected to the R light-emitting unit in the second light-emitting component; if one driving unit is connected to the G light-emitting unit in the first light-emitting component, this driving unit is also electrically connected to the G light-emitting unit in the second light-emitting component; and if one driving unit is connected to the B light-emitting unit in the first light-emitting component, this driving unit is also electrically connected to the B light-emitting unit in the second light-emitting component, thereby achieving simultaneous control of the light-emitting units of the same color.

In other embodiments of the present disclosure, the second driving element may also be connected only to the second light-emitting component, that is, the driving units in the second driving element may be separately electrically connected to the light-emitting units in the second light-emitting component, thereby driving each of the light-emitting units to achieve individual control of the second light-emitting component. The embodiments of the present disclosure are not so limited, as long as the control of the corresponding light-emitting units can be performed by using different driving units, such solution can be used as an embodiment of the present disclosure. In addition, the number of the driving units and the light-emitting units in the embodiment of the present disclosure may be set according to requirements, and is not limited herein.

Figure 7:
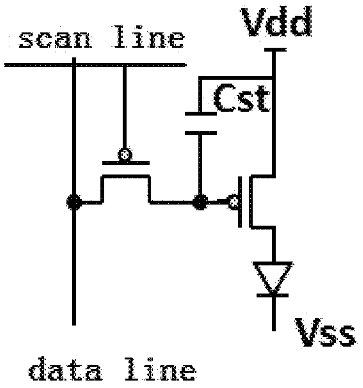
FIG. 7 illustrates a circuit configuration diagram of a driving unit within a driving element in an OLED display screen according to an embodiment of the present disclosure.

FIG. 7 is a schematic diagram showing a circuit structure of a driving unit in a driving element in an OLED display screen according to an embodiment of the present disclosure. The circuit structure of each driving unit in the driving element in the embodiment of the present disclosure may be implemented as shown in FIG. 7. As shown in FIG. 7, the circuit structures of the driving units in the first driving element 31 and the second driving element 32 may be the same or different. The circuit structure of the driving unit in the embodiment of the present disclosure may also be other forms of circuit structure. That is, the circuit structure of the driving unit of the embodiment of the present disclosure is not limited to the 2TIC circuit shown in FIG. 7, and may be, for example, other circuits of the 6TIC or 7TIC driving circuit, which is not specifically limited in this disclosure. As long as the driving of the corresponding light-emitting unit can be realized, such circuit can be taken as an embodiment of the present disclosure.

Figure 8:
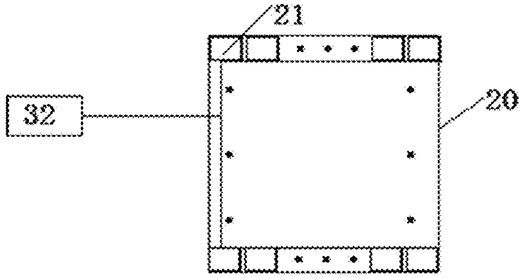
FIG. 8 is a schematic diagram showing a connection relationship between a second light-emitting component and a second driving element in an OLED display screen according to an embodiment of the present disclosure.

FIG. 8 is a schematic diagram showing a connection relationship between a second light-emitting component and a second driving element in an OLED display screen according to an embodiment of the present disclosure. The second area 20 may include a plurality of second light-emitting components 21, and the second light-emitting components may be arranged in m rows and n columns, m and n being positive integers greater than or equal to 1. The $m \times n$ second light-emitting components 21 may be electrically connected to one second driving element 32, and emit light under driving of the connected driving element 32.

In addition, in the embodiment of the present disclosure, the second driving element 32 connected to the second light-emitting components 21 may be adjacent to the second area 20 in the first area, thereby facilitating the connection between the second light-emitting components and the second driving element. Moreover, when the second light-emitting component is further connected to the first light-emitting component in the first area, it is possible to make the second light-emitting components exhibit the same light-emitting state as the first light-emitting components corresponding to the connected second driving element.

In other embodiments of the present disclosure, the second light-emitting components 21 may also be connected to different second driving elements 32 to drive each of the second light-emitting components 21 to emit light by different second driving elements 32. In the embodiment of the present disclosure, the second light-emitting components connected to the same second driving element may form one group, that is, the second light-emitting components 21 in the second area 20 may be divided into a plurality of groups, and each group may include at least one second light-emitting component 21, wherein the second light-emitting components 21 within the same group are connected to the same second driving element 32, and the second light-emitting components 21 within different groups are connected to different second driving elements 32. In the embodiment of the present disclosure, the second light-emitting components 21 may be grouped as required, and since the second light-emitting components in each group are connected to the same second driving element 32, the second light-emitting components in the same group 21 may exhibit the same light-emitting state. A person skilled in the art may group the second light-emitting components in the second area according to different display requirements, which is not specifically limited in the embodiment of the present disclosure.

Figure 9:
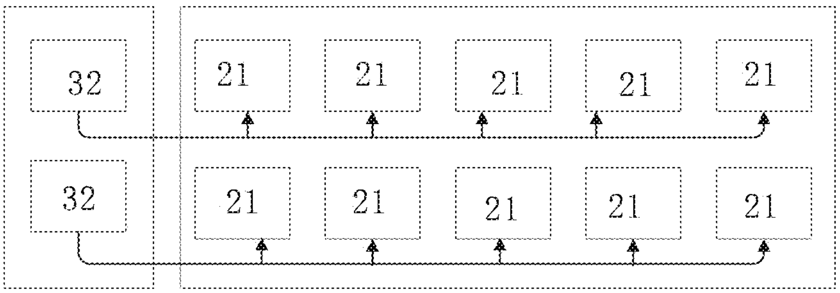
FIG. 9 is a schematic diagram showing a connection relationship between a second light-emitting component and a second driving element in an OLED display screen according to some embodiments of the present disclosure.
Figure 10:
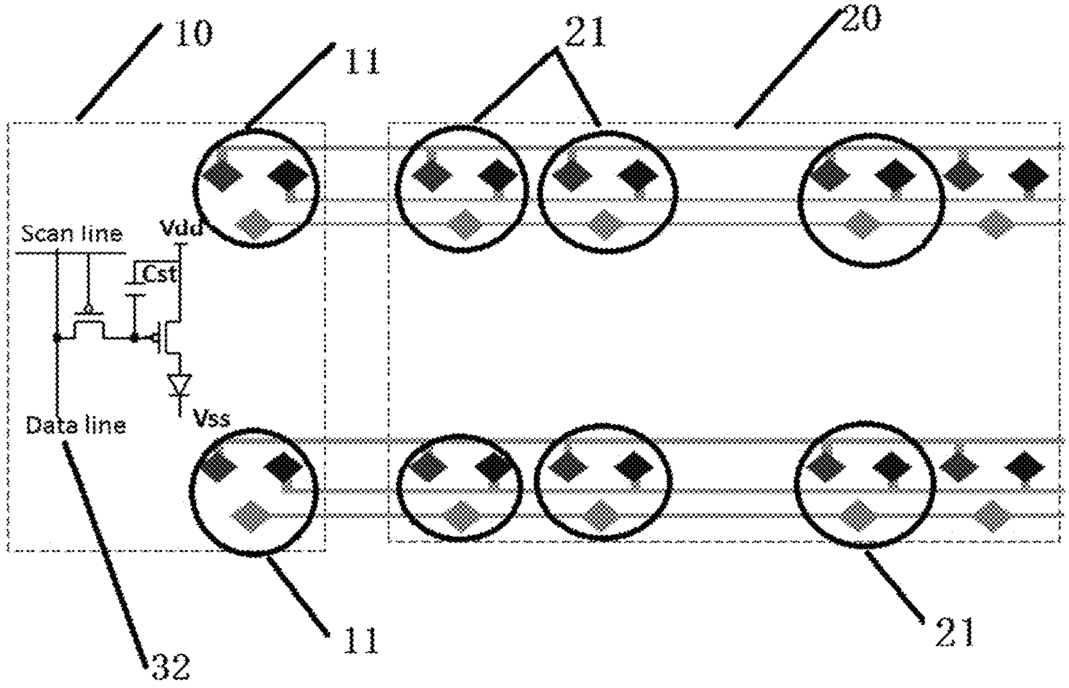
FIG. 10 is a schematic diagram showing a connection relationship between a second light-emitting component and a second driving element in an OLED display screen according to some embodiments of the present disclosure.

FIGS. 9 and 10 illustrate schematic diagrams of connection relationships between a second light-emitting component and a second driving element in an OLED display screen according to some embodiments of the present disclosure. In the embodiment of the present disclosure, the second light-emitting components 21 may be grouped in a row manner. The second light-emitting components 21 of the same row in the second area 20 may be located in the same group, and each group may include at least one row of second light-emitting components. For example, in an embodiment, the second light-emitting component 21 of each row may be grouped into one group, so that the second light-emitting components in the second area may be divided into multiple groups corresponding to the number of rows, and the second light-emitting components in each row acts as a group. At this point, the second light-emitting components within one group may be coupled to one second driving element 32 to be driven to emit light through the connected second driving element 32. As shown in FIG. 9, a plurality of rows of second light-emitting components 21 (such as two rows of second light-emitting components 21) may be included, each row of second light-emitting components forms a group, and each row of second light-emitting components is electrically connected to respective second driving elements. The electrical connection of the second light-emitting components 21 and the respective second drive component 32 may be realized by a conductive medium, respectively. Here, it should be noted that only one second driving element 32 is shown in FIG. 9, which may be understood that each group of the second light-emitting components is connected to one second driving element 32.

In other embodiments of the present disclosure, one group may include at least two rows of the second light-emitting components 21, which is not limited by the embodiment of the present disclosure. By grouping the second light-emitting components in rows, it is possible to conveniently control the light-emitting state of each second light-emitting component. For example, each group may present a different light-emitting state, or the second light-emitting components within each group may exhibit the same light-emitting state as the first light-emitting component corresponding to the connected second driving element. Different lighting effects can be achieved by controlling each group.

Figure 11:
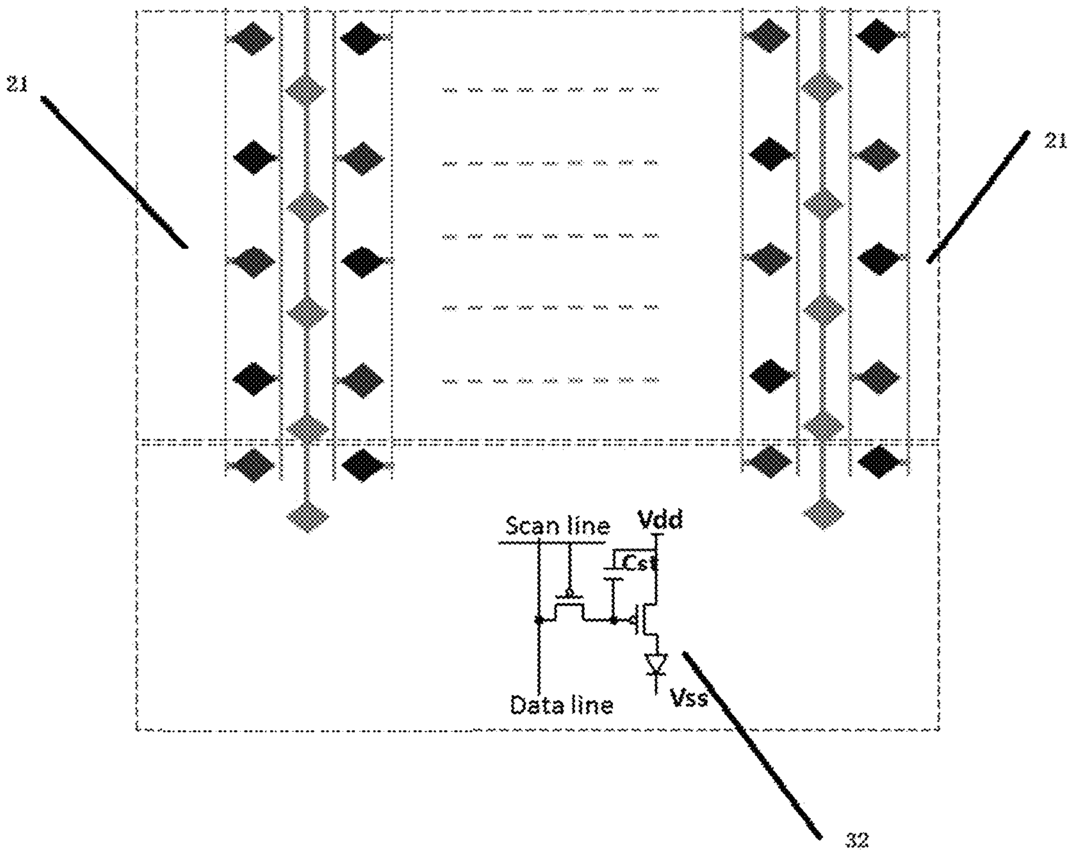
FIG. 11 is a schematic diagram showing a connection relationship between a second light-emitting component and a second driving element in an OLED display screen according to some embodiments of the present disclosure.

FIG. 11 is a schematic diagram showing a connection relationship between a second light-emitting component and a second driving element in an OLED display screen according to other embodiments of the present disclosure. In other embodiments of the present disclosure, the second light-emitting components 21 may be grouped by columns. The second light-emitting components 21 of the same column in the second area 20 may be located in the same group, and each group may include at least one column of the second light-emitting components. For example, in a possible implementation, the second light-emitting component 21 of each column may be grouped into one group, so that the second light-emitting components in the second area may be divided into multiple groups corresponding to the number of columns, and each column of the second light-emitting component acts as one group. At this point, the second light-emitting components within one group may be connected to one second driving element 32, and are driven to emit light through the connected second driving element 32. As shown in FIG. 11, a plurality of columns of second light-emitting components 21 (such as two columns of second light-emitting components 21) may be included, each column of second light-emitting components forms a group, and the second light-emitting components of each column are electrically connected to individual second driving elements 32 respectively. The electrical connection of the second light-emitting components and the respective second driving elements 32 may be implemented by a conductive medium, respectively. It should be noted here that only one second driving element 32 is shown in FIG. 10, which can be understood that each group of second light-emitting components is connected to one second driving element 32.

In other embodiments of the present disclosure, one group may include at least two columns of the second light-emitting components 21, which is not limited by the embodiment of the present disclosure. By grouping the second light-emitting components in columns, it is possible to conveniently control the light-emitting state of the second light-emitting components. For example, each group may present different light-emitting states, or the second light-emitting components within each group may exhibit the same light-emitting state as the first light-emitting component corresponding to the connected second driving element. Different lighting effects can be achieved by controlling each group.

In addition, in the embodiment of the present disclosure, a second driving element 32 may be separately provided for each group, and the second driving element may be disposed at a position adjacent to the corresponding group to facilitate connection with the second light-emitting component.

Further, in an embodiment of the present disclosure, the second light-emitting component of each row in the second area 20 may be divided into a plurality of groups, each of the plurality of groups may be connected to one second driving element, and the number of the groups in each row may be the same or different, and may be set according to the shape of the second area or the design requirement, which is not limited in the embodiment of the present disclosure. Alternatively and/or additionally, the second light-emitting component of each column in the second area 20 may be divided into a plurality of groups, each of the plurality of groups may be connected to one second driving element, and the number of the groups in each column may be the same or different, and may be set according to the shape of the second area or the design requirement, which is not limited by the embodiment of the present disclosure. In other embodiments of the present disclosure, at least one row of second light-emitting components in the second area are respectively located in different groups; or at least one column of the second light-emitting components in the second area are located in different groups. That is, in the embodiment of the present disclosure, at least one row constitutes one group, or a plurality of groups may be included in one row, which is not limited by the embodiment of the present disclosure.

Figure 12:
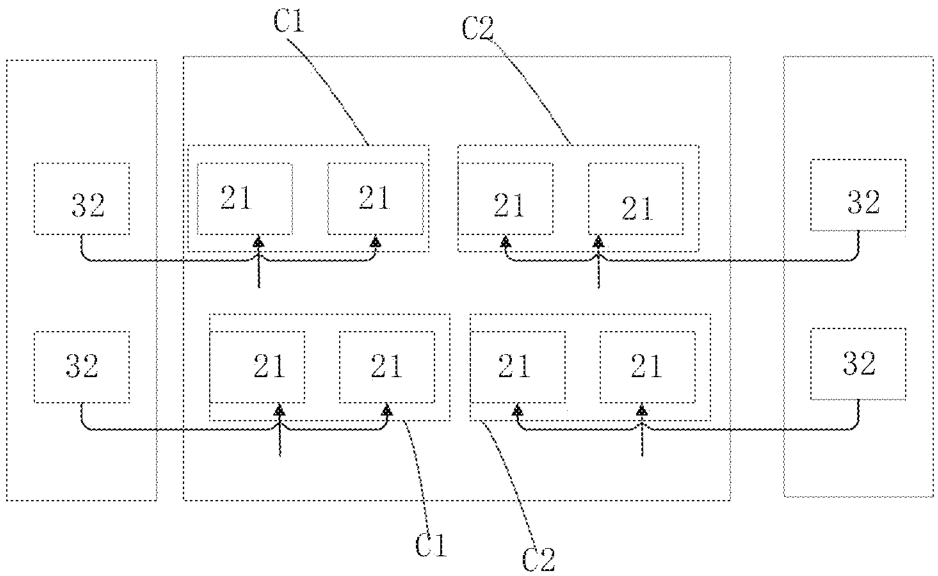
FIG. 12 is a schematic diagram showing a connection relationship between a second light-emitting component and a second driving element in an OLED display screen according to some embodiments of the present disclosure.
Figure 13:
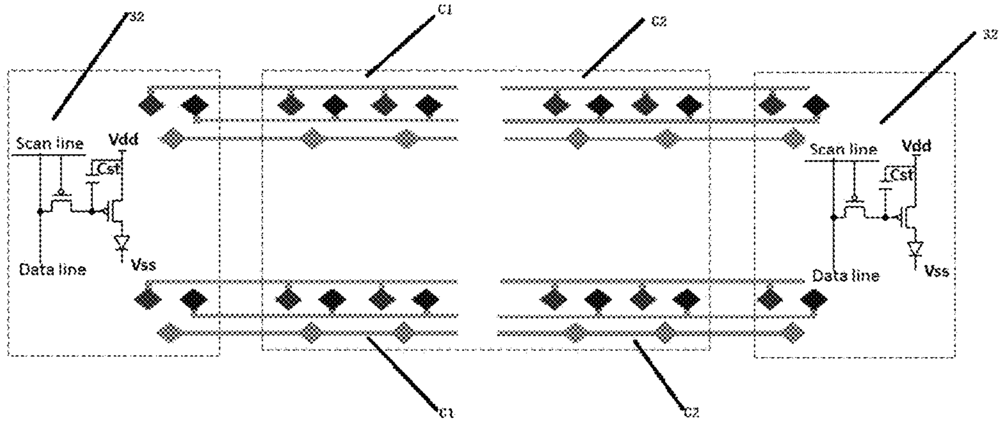
FIG. 13 is a schematic diagram showing a connection relationship between a second light-emitting component and a second driving element in an OLED display screen according to some embodiments of the present disclosure.

FIGS. 12 and 13 illustrate schematic diagrams of connection relationships between a second light-emitting component and a second driving element in an OLED display screen according to some embodiments of the present disclosure. The second light-emitting components of each row may be divided into a first group C1 and a second group C2 adjacent to the first group C1; and, the second light-emitting components 21 in the first group C1 are connected to the second driving element 32 adjacent to the first group C1 in this row; the second light-emitting components 21 in the second group C2 are connected to the second driving element 32 corresponding to the first light-emitting component adjacent to the second group in this row. That is, the second light-emitting components 21 in each group of the embodiments of the present disclosure may be connected to the second driving element adjacent to the group, and may be driven to emit light by the connected second driving element.

Figure 14:
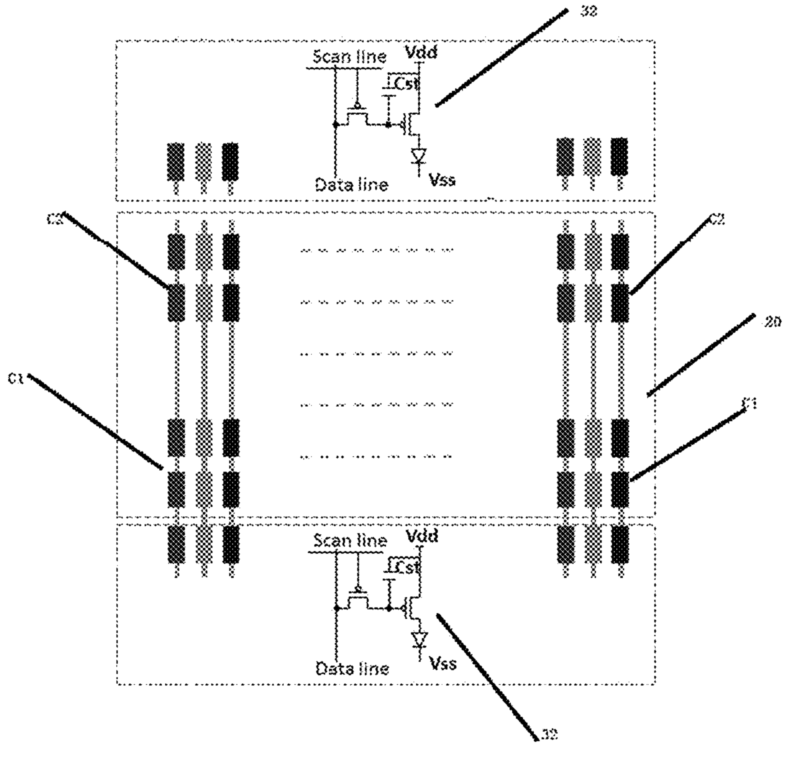
FIG. 14 is a schematic diagram showing a connection relationship between a second light-emitting component and a second driving element in an OLED display screen according to some embodiments of the present disclosure.

FIG. 14 is a schematic diagram showing a connection relationship between a second light-emitting component and a second driving element in an OLED display screen according to some embodiments of the present disclosure. The second light-emitting components of each column may be divided into a third group C1 and a fourth group C2 adjacent to the third group C1; and the second light-emitting components in the third group C1 are connected to the second driving element 32 adjacent to the third group C1 in this column; the second light-emitting components in the fourth group C2 are connected to the second driving element 32 corresponding to the first light-emitting component adjacent the fourth group in this column. That is, the second light-emitting components in each group of the embodiments of the present disclosure may be connected to the second driving element adjacent to the group, and may emit light by the driving of the connected second driving element.

In addition, in the embodiment of the present disclosure, the second light-emitting components located in the same group are disposed adjacent to each other, so that the connection between the light-emitting components and the driving element can be facilitated, and the display effect of each light-emitting component can be conveniently controlled.

In the embodiments of the present disclosure, the driving element may not be provided in a part of the display area of the display screen, and the driving element disposed in another area is used for driving the light-emitting by electrical connection, so that the part of the area may be in a transparent state; in addition, when disposing functional components such as a camera or the like, the functional components can be directly placed in the area with the transparent state, without having to slot for the functional components or leave other position, which is convenient for the full screen design of the display screen.

Figure 15:
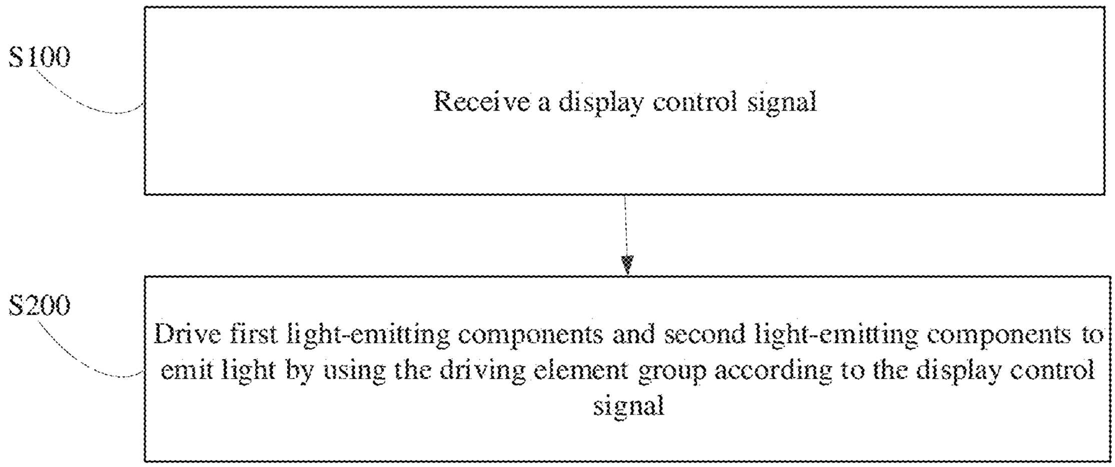
FIG. 15 illustrates a flow chart of a display control method according to an embodiment of the present disclosure.

The embodiment of the present disclosure further provides a display control method, which may be used to control display of the OLED display screen described in the above embodiments. FIG. 15 illustrates a flow chart of a display control method according to an embodiment of the present disclosure. The display control method may include the following steps.

In S100, a display control signal is received.

In S200, first light-emitting components and second light-emitting components are driven to emit light by using the driving element group according to the display control signal.

For a specific configuration of the driving element group and each of the light-emitting components, reference may be made to the description of the above OLED display screen, and the present disclosure is not described herein again.

Figure 16:
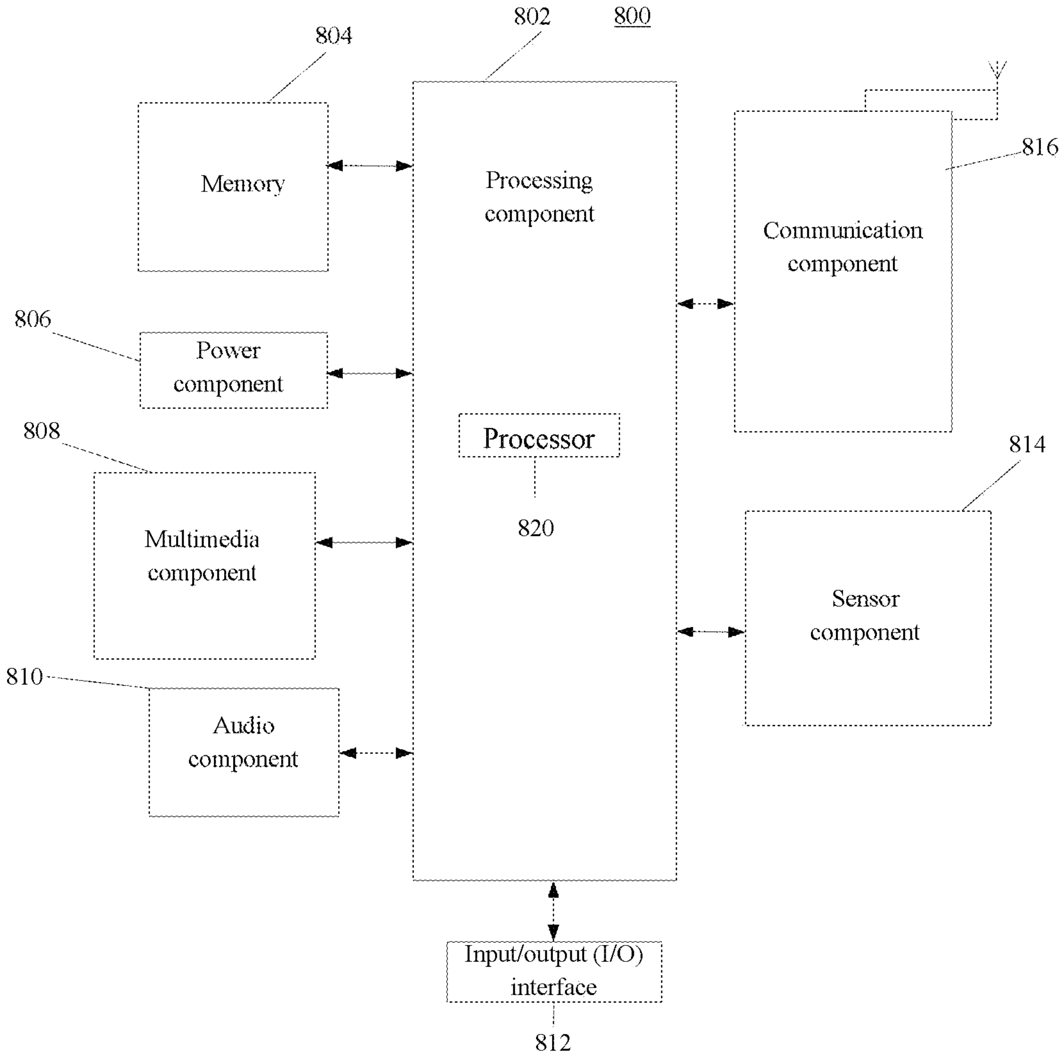
FIG. 16 shows a block diagram of an electronic device according to an embodiment of the present disclosure.

In addition, the embodiment of the present disclosure further provides an electronic device, which may include the OLED display screen provided by the above embodiments, wherein the second area may be provided with a functional component such as a camera assembly. For example, FIG. 16 illustrates a block diagram of an electronic device in accordance with an embodiment of the present disclosure. For example, an apparatus 800 (electronic device) may be a mobile phone, a computer, a digital broadcast terminal, a messaging apparatus, a gaming console, a tablet, a medical apparatus, exercise equipment, a personal digital assistant, and other electronic devices having a display function.

Referring to FIG. 16, the apparatus 800 may include one or more of the following components: a processing component 802, a memory 804, a power component 806, a multimedia component 808, an audio component 810, an input/output (I/O) interface 812, a sensor component 814, and a communication component 816.

The processing component 802 typically controls overall operations of the apparatus 800, such as the operations associated with display, telephone calls, data communications, camera operations, and recording operations. The processing component 802 may include one or more processors 820 to execute instructions to perform all or part of the steps in the above described methods. Moreover, the processing component 802 may include one or more modules which facilitate the interaction between the processing component 802 and other components. For instance, the processing component 802 may include a multimedia module to facilitate the interaction between the multimedia component 808 and the processing component 802.

The memory 804 is configured to store various types of data to support the operation of the apparatus 800. Examples of such data include instructions for any applications or methods operated on the apparatus 800, contact data, phonebook data, messages, pictures, video, etc. The memory 804 may be implemented using any type of volatile or non-volatile memory apparatuses, or a combination thereof, such as a static random access memory (SRAM), an electrically erasable programmable read-only memory (EEPROM), an erasable programmable read-only memory (EPROM), a programmable read-only memory (PROM), a read-only memory (ROM), a magnetic memory, a flash memory, a magnetic or optical disk.

The power component 806 provides power to various components of the apparatus 800. The power component 806 may include a power management system, one or more power sources, and any other components associated with the generation, management, and distribution of power in the apparatus 800.

The multimedia component 808 includes a screen providing an output interface between the apparatus 800 and the user. In some embodiments, the screen may include a liquid crystal display (LCD) and a touch panel (TP). If the screen includes the touch panel, the screen may be implemented as a touch screen to receive input signals from the user. The touch panel includes one or more touch sensors to sense touches, swipes, and gestures on the touch panel. The touch sensors may not only sense a boundary of a touch or swipe action, but also sense a period of time and a pressure associated with the touch or swipe action. In some embodiments, the multimedia component 808 includes a front camera and/or a rear camera. The front camera and the rear camera may receive an external multimedia datum while the apparatus 800 is in an operation mode, such as a photographing mode or a video mode. Each of the front camera and the rear camera may be a fixed optical lens system or have focus and optical zoom capability.

The audio component 810 is configured to output and/or input audio signals. For example, the audio component 810 includes a microphone (MIC) configured to receive an external audio signal when the apparatus 800 is in an operation mode, such as a call mode, a recording mode, and a voice recognition mode. The received audio signal may be further stored in the memory 804 or transmitted via the communication component 816. In some embodiments, the audio component 810 further includes a speaker to output audio signals.

The I/O interface 812 provides an interface between the processing component 802 and peripheral interface modules, such as a keyboard, a click wheel, buttons, and the like. The buttons may include, but are not limited to, a home button, a volume button, a starting button, and a locking button.

The sensor component 814 includes one or more sensors to provide status assessments of various aspects of the apparatus 800. For instance, the sensor component 814 may detect an open/closed status of the apparatus 800, relative positioning of components, e.g., the display and the keypad, of the apparatus 800, a change in position of the apparatus 800 or a component of the apparatus 800, a presence or absence of user contact with the apparatus 800, an orientation or an acceleration/deceleration of the apparatus 800, and a change in temperature of the apparatus 800. The sensor component 814 may include a proximity sensor configured to detect the presence of nearby objects without any physical contact. The sensor component 814 may also include a light sensor, such as a CMOS or CCD image sensor, for use in imaging applications. In some embodiments, the sensor component 814 may also include an accelerometer sensor, a gyroscope sensor, a magnetic sensor, a pressure sensor, or a temperature sensor.

The communication component 816 is configured to facilitate communication, wired or wirelessly, between the apparatus 800 and other apparatus. The apparatus 800 may access a wireless network based on a communication standard, such as WiFi, 2G, or 3G, or a combination thereof. In one exemplary embodiment, the communication component 816 receives a broadcast signal or broadcast associated information from an external broadcast management system via a broadcast channel. In one exemplary embodiment, the communication component 816 further includes a near field communication (NFC) module to facilitate short-range communications. For example, the NFC module may be implemented based on a radio frequency identification (RFID) technology, an infrared data association (IrDA) technology, an ultra-wideband (UWB) technology, a Bluetooth (BT) technology, and other technologies.

In exemplary embodiments, the apparatus 800 may be implemented with one or more application specific integrated circuits (ASICs), digital signal processors (DSPs), digital signal processing apparatuses (DSPDs), programmable logic apparatuses (PLDs), field programmable gate arrays (FPGAs), controllers, micro-controllers, microprocessors, or other electronic components, for performing the above described methods.

In exemplary embodiments, there is also provided a non-transitory computer-readable storage medium including instructions, such as the memory 804 including instructions, the above instructions may be executed by the processor 820 in the apparatus 800 for performing the above-described methods. For example, the non-transitory computer-readable storage medium may be a ROM, a Random Access Memory (RAM), a CD-ROM, a magnetic tape, a floppy disc, an optical data storage device, and the like.

Other embodiments of the present disclosure will be apparent to those skilled in the art from consideration of the specification and practice of the disclosure disclosed here. The present disclosure is intended to cover any variations, uses, or adaptations of the present disclosure following the general principles thereof and including such departures from the present disclosure as come within known or customary practice in the art. It is intended that the specification and examples be considered as exemplary only, with a true scope and spirit of the disclosure being indicated by the following claims.

It will be appreciated that the present disclosure is not limited to the exact construction that has been described above and illustrated in the accompanying drawings, and that various modifications and changes may be made without departing from the scope thereof. It is intended that the scope of the disclosure only be limited by the appended claims.

What is claimed is:

1. An organic light-emitting diode (OLED) display screen, comprising:

a first area provided with a plurality of first light-emitting components;

a second area provided with a plurality of second light-emitting components; and a driving element group electrically connected to the first light-emitting components and the second light-emitting components to drive the first light-emitting components and the second light-emitting components to emit light;

wherein the driving element group is disposed in an area other than the second area on the display screen and disposed in the first area and a spacing area between the first area and the second area, thereby the second area being in a transparent state, wherein the driving element group comprises:

at least one first driving element disposed in the first area and electrically connected only to a corresponding first light-emitting component to drive the connected first light-emitting component to emit light; and at least one second driving element disposed in the first area and electrically connected to a corresponding first light-emitting component and a corresponding second light-emitting component to drive the connected first and second light-emitting components to emit light;

wherein the second light-emitting components in the second area are connected to the same at least one second driving element; and wherein each of the at least one first driving element and the at least one second driving element comprises a plurality of driving units, each of the first light-emitting components and the second light-emitting components comprises a plurality of light-emitting units of different colors;

the driving units in a first driving element are respectively connected in a one-to-one correspondence with the light-emitting units in a first light-emitting component to which the first driving element is connected, and the driving units in a second driving element are respectively connected in a one-to-one correspondence with the light-emitting units in a second light-emitting component, and when the second driving element is connected to the first light-emitting component, the driving units in the second driving element are connected in a one-to-one correspondence with the light-emitting units in the first light-emitting component, and the light-emitting units connected to a same driving unit have a same light-emitting color.

2. The OLED display screen according to claim 1, wherein the driving element group comprises:

a plurality of first driving elements disposed in the first area and electrically connected to the first light-emitting components in a one-to-one correspondence to drive the connected first light-emitting components to emit light; and at least one second driving element disposed in the first area, or in the first area and the spacing area, and electrically connected only to a corresponding second light-emitting component to drive the connected second light-emitting component to emit light.

3. The OLED display screen according to claim 1, wherein the second driving element is electrically connected to the corresponding second light-emitting component through a conductive medium.

4. The OLED display screen according to claim 1, wherein the second light-emitting components in the second area are divided into a plurality of groups, each group comprising at least one second light-emitting component;

the second light-emitting components within a same group are connected to a same second driving element, and the second light-emitting components within different groups are connected to different second driving elements.

5. The OLED display screen according to claim 1, wherein the second light-emitting components of a same row in the second area are located in a same group, each group comprising at least one row of second light-emitting components.

6. The OLED display screen according to claim 1, wherein the second light-emitting components of a same column in the second area are located in a same group, each group comprising at least one column of second light-emitting components.

7. The OLED display screen according to claim 1, wherein the second driving element to which the second light-emitting components of each group are connected is located at an edge of the first area adjacent to the group.

8. The OLED display screen according to claim 7, wherein the second light-emitting components of each row in the second area are divided into a first group and a second group adjacent to the first group;

a second light-emitting component in the first group is connected to the second driving element adjacent to the first group in a same row; and a second light-emitting component in the second group is connected to the second driving element adjacent to the second group in a same row.

9. The OLED display screen according to claim 7, wherein the second light-emitting components of each column in the second area are divided into a third group and a fourth group adjacent to the third group;

a second light-emitting component in the third group is connected to the second driving element adjacent to the third group in a same column; and a second light-emitting component in the fourth group is connected to the second driving element adjacent to the fourth group in a same column.

10. The OLED display screen according to claim 4, wherein the second light-emitting components located in the same group are disposed adjacent to each other.

11. The OLED display screen according to claim 3, wherein the conductive medium is formed of a transparent conductive material.

12. The OLED display screen according to claim 3, wherein the conductive medium comprises at least one of a metal wire or a conductive paste layer.

13. The OLED display screen according to claim 1, wherein at least one of the light-emitting units comprises a light-emitting diode.

14. A display control method applied in an organic light-emitting diode (OLED) display screen, wherein the display screen comprises a first area, a second area and a driving element group, the first area comprises a plurality of first light-emitting components, the second area comprises a plurality of second light-emitting components, and the driving element group is disposed in an area other than the second area on the display and disposed in the first area and a spacing area between the first area and the second area, thereby the second area being in a transparent state; and the method comprises:

receiving a display control signal; and driving the first light-emitting components and the second light-emitting components to emit light by using the driving element group according to the display control signal, wherein the driving element group comprises:

at least one first driving element disposed in the first area and electrically connected only to a corresponding first light-emitting component to drive the connected first light-emitting component to emit light; and at least one second driving element disposed in the first area and electrically connected to a corresponding first light-emitting component and a corresponding second light-emitting component to drive the connected first and second light-emitting components to emit light;

wherein the second light-emitting components in the second area are connected to the same at least one second driving element; and wherein each of the at least one first driving element and the at least one second driving element comprises a plurality of driving units, each of the first light-emitting components and the second light-emitting components comprises a plurality of light-emitting units of different colors;

the driving units in a first driving element are respectively connected in a one-to-one correspondence with the light-emitting units in a first light-emitting component to which the first driving element is connected, and the driving units in a second driving element are respectively connected in a one-to-one correspondence with the light-emitting units in a second light-emitting component, and when the second driving element is connected to the first light-emitting component, the driving units in the second driving element are connected in a one-to-one correspondence with the light-emitting units in the first light-emitting component, and the light-emitting units connected to a same driving unit have a same light-emitting color.

15. An electronic device, comprising: an organic light-emitting diode (OLED) display screen, wherein the OLED display screen comprises:

a first area provided with a plurality of first light-emitting components;

a second area provided with a plurality of second light-emitting components; and a driving element group electrically connected to the first light-emitting components and the second light-emitting components to drive the first light-emitting components and the second light-emitting components to emit light;

wherein the driving element group is disposed in an area other than the second area on the display screen and disposed in the first area and a spacing area between the first area and the second area, thereby the second area being in a transparent state, wherein the driving element group comprises:

at least one first driving element disposed in the first area and electrically connected only to a corresponding first light-emitting component to drive the connected first light-emitting component to emit light; and at least one second driving element disposed in the first area and electrically connected to a corresponding first light-emitting component and a corresponding second light-emitting component to drive the connected first and second light-emitting components to emit light;

wherein the second light-emitting components in the second area are connected to the same at least one second driving element; and wherein each of the at least one first driving element and the at least one second driving element comprises a plurality of driving units, each of the first light-emitting components and the second light-emitting components comprises a plurality of light-emitting units of different colors;

the driving units in a first driving element are respectively connected in a one-to-one correspondence with the light-emitting units in a first light-emitting component to which the first driving element is connected, and the driving units in a second driving element are respectively connected in a one-to-one correspondence with the light-emitting units in a second light-emitting component, and when the second driving element is connected to the first light-emitting component, the driving units in the second driving element are connected in a one-to-one correspondence with the light-emitting units in the first light-emitting component, and the light-emitting units connected to a same driving unit have a same light-emitting color.

16. The electronic device according to claim 15, wherein the second area is further provided with an imaging component.

* * * * *